United States Patent [19]

Imperato

[11] Patent Number: 5,373,237
[45] Date of Patent: Dec. 13, 1994

[54] RADIO FREQUENCY POWER MEASUREMENT SYSTEM

[76] Inventor: John Imperato, 680 47th Ave., San Francisco, Calif. 94121

[21] Appl. No.: 71,439

[22] Filed: Jun. 2, 1993

[51] Int. Cl.⁵ ............................................. G01R 1/04
[52] U.S. Cl. ................................................. 324/99 D
[58] Field of Search .................. 324/76.14, 58, 62, 77, 324/638, 650; 330/279; 380/7; 342/47, 375; 356/128; 455/192.1; 331/4

[56] References Cited

U.S. PATENT DOCUMENTS 3,869,666  3/1975  Saltz et al. ................... 324/76 R
4,599,618  7/1986  Haendel et al. .................. 343/7.5

OTHER PUBLICATIONS

I. Braithwaite, "An RF Voltmeter," *Ham Radio*, pp. 65–75 (Nov. 1987).

*Primary Examiner*—Kenneth A. Wieder
*Assistant Examiner*—Barry C. Bowser
*Attorney, Agent, or Firm*—David J. Larwood

[57] ABSTRACT

A control system for RF (radio frequency) power measurements eliminates calibration requirements and compensates errors due to nonlinear detector characteristics and temperature drifts by using feedback to automatically adjust the power of a fixed frequency temperature stable reference signal to equal the power of the unknown incoming signal. Since the power of the reference can be precisely known, the power of the unknown signal is determined. The reference signal path has an identical electrical transfer function as the measurement input signal path so that nonlinearities and temperature variation in the measurement path are exactly offset by the corresponding variations in the feedback reference path.

12 Claims, 1 Drawing Sheet

RADIO FREQUENCY POWER MEASUREMENT SYSTEM

FIELD OF THE INVENTION

The present invention generally relates to measurement of power of electrical signals and particularly to feedback control systems that compensate for errors due to electrical and thermal characteristics of power detecting elements.

BACKGROUND

Many applications require accurate measurement of power radio frequency. These applications include calibrating equipment for radio, television and cellular telephone broadcasting, and field or laboratory applications in which portability is advantageous.

Traditional power measurement compares a known, fixed reference power with the unknown signal, an open loop system to acquire the unknown signal. Prior art open loop power measurement systems require significant signal conditioning to interpret sensing element transfer functions and display absolute, calibrated power accurately. A separate processing unit or meter is required. The very small (microvolt) DC signals from the sensing element must be carried on a signal cable connecting the sensor to the meter. Transmitted low level DC signals are susceptible to drifts, thermocouple voltages, noise and other interference, so some additional signal processing and amplification are performed in the power sensor in close proximity to the sensing element. See I. Braithwaite, "An RF Voltmeter," *Ham Radio*, pp. 65–75 (November 1987).

Using prior art methods to perform a calibrated power measurement, the power sensor must first be calibrated with the known reference signal (which is usually traceable to a standard) of a fixed frequency and amplitude by physically connecting the sensor to the reference signal port on the power meter. Once the meter is calibrated to that sensor, it can be connected to a device to perform a measurement. Thermal drifts due to ambient temperature changes or self heating of the sensor element are nulled out by "zeroing" the sensor with DC feedback offsets when no applied signal is present.

Zeroing in this manner has significant limitations. When measurements are performed over a variety of power levels, repeated zeroing is necessary to offset errors due to self-heating of the sensing element. On some power meters, this zeroing function can be programmed by a computer, but this is very slow, often taking as long as ten seconds to perform. Since it is often difficult to determine when zeroing is required, users perform this time-consuming operation at the start of a measurement sequence and at times when the device under test (DUT) power level is expected to change significantly. During the zeroing operation it is mandatory that no signal power be present at the sensor input. This may require disconnecting the sensor from the DUT or further disturbing the DUT operating conditions by turning off DC bias voltages if present or using another disruptive means to assure that no power be present at the sensor input.

The signal processing requirements of open loop systems virtually exclude implementation in a modular, single component, portable measurement instrument.

SUMMARY OF THE INVENTION

The present invention provides a radio frequency power measurement system that uses feedback control to compensate for errors due to nonlinear electrical characteristics and thermal variations of power detecting elements. An unknown power input from an unknown device under test is compared with a second internal input driven by an oscillator with well-known operating parameters. Any imbalance in the inputs generates an error signal which is used to automatically adjust the power of a fixed frequency temperature stable reference signal in the feedback loop to equal the power of the unknown incoming signal Information about the error is used to derive the amplitude of the unknown input and the results are displayed. Since the power of the reference can be precisely known, the power of the unknown signal is determined. The reference signal path and the measurement input signal path have an identical electrical transfer function so that nonlinearities and temperature variation in the measurement path are exactly offset by the corresponding variations in the feedback reference path. This eliminates calibration requirements and compensates errors due to nonlinear detector characteristics and temperature drifts.

Many of the problems of the open loop systems are avoided with this measurement approach. The need in prior art devices for calibration, signal processing and zeroing are eliminated. Although active feedback measurement systems have been around for several years, none calibrate out detector sensing element characteristics as does this new system. This closed loop system reduces the signal processing requirements involved in the interpretation of sensor devices thus making it very practical to build a portable integrated power measuring instrument.

DETAILED DESCRIPTION OF THE INVENTION

Figure 1:
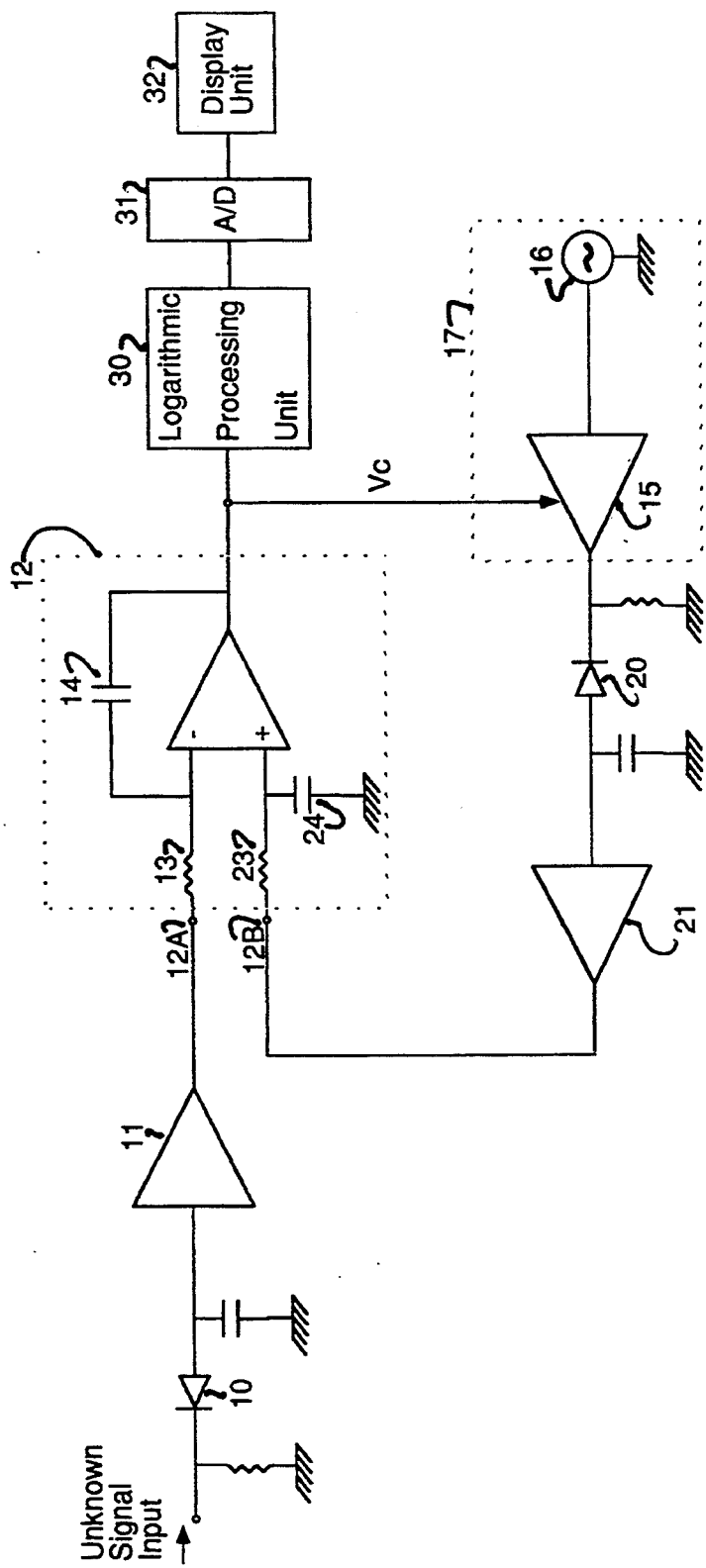
FIG. 1 illustrates a block diagram of the power measurement feedback system.

Referring to the power measurement feedback system block diagram in FIG. 1, the RF signal of unknown amplitude is presented to input detector 10. In one preferred embodiment, the detector element is a low capacitance silicon or gallium arsenide Schottky diode. Detector 10 puts out a DC voltage which has a nonlinear relationship to the input signal amplitude over the detector's operating range. This DC voltage is amplified in amplifier 11, then passed to input 12A of difference integrator 12. In a preferred implementation, amplifier 11 and amplifier 21 are logarithmic amplifiers, balanced to provide an identical electrical transfer function.

The output port of difference integrator 12 provides a control voltage for the variable gain control input of amplifier 15 in variable power reference 17 section, which then connects through amplifier 21 to difference integrator 12 to form a closed loop. When the loop is unbalanced, the output port of difference integrator 12 generates an error voltage signal which is applied to the variable gain control of the variable power reference 17. The reference power is adjusted by this error signal. The output of 17, a 1 MHz RF signal, is presented to detector 20, which is fabricated to have transfer characteristics identical to input detector 10. The output of detector 20 is a DC voltage which has a nonlinear relationship to the input signal amplitude over its operating range. This DC voltage is amplified in amplifier 21 (preferably identical to 11), then passed to input 12B of difference integrator 12. Resistors 13, 23 and capacitors 14, 24 form the dominant integrator pole in the feedback system.

The polarities and loop gains are set such that in the balanced state, the input levels at each of inputs 12A and 12B to difference integrator 12 are exactly equal. Since the transfer functions of the detecting elements and amplifiers are chosen to be equal, this mandates that the power into each of detecting elements 10 and 20 are exactly equal. To summarize, in the balanced state, through feedback control, the reference power from 17 (to detector 20) is automatically adjusted to exactly equal the unknown incoming power at detector 10. There is a precise mathematical relationship between the voltage signal ($V_c$) put out by difference integrator 12 and applied to variable power reference 17 and the RF power output of variable power reference 17 ($P_{out}$) which under balanced conditions is equal to the unknown input signal. Logarithmic processing unit 30 calculates the mathematical relationship between the DC control voltage ($V_c$) and reference power output in dBm. Analog-to-digital converter 31 converts and scales the analog output voltage of the logarithmic processing unit and the result is displayed as a power reading on display unit 32.

In a preferred embodiment, all circuitry is implemented using low dissipation integrated circuits with a low power liquid crystal display, which enables implementation of the power meter as a small, battery-powered instrument. The entire system draws less than 12 mA from a single battery or power supply.

Since the input power is constantly being compared to the adjustable power reference, no sensor calibration is required. The need for zeroing the sensor as required by the prior art is also eliminated. Since the two paths in the power measurement feedback loop are identical and operate under the same power conditions, any self-heating of the detector elements are equal and offsets due to thermocouple voltage effects are equal. Because averaging is not used as required by the open loop prior art, measurement times are significantly shorter. The measurement is stable within the settling time of the control feedback loop.

A general description of the device and method of using the present invention as well as a preferred embodiment of the present invention has been set forth above. One skilled in the art will recognize and be able to practice many changes in many aspects of the device and method described above, including variations which fall within the teachings of this invention. The spirit and scope of the invention should be limited only as set forth in the claims which follow.

What is claimed is:

1. An automatic control system for radio frequency power measurement, said system comprising
   an input means for receiving a radio frequency power input,
   a first detector means coupled to said input means, said first detector for sensing radio frequency power,
   an adjustable signal source means for generating a reference radio frequency signal with an adjustable power,
   a second detector means coupled to said adjustable signal source means, said second detector for sensing the power of said reference radio frequency signal,
   a first amplifier means coupled to said first detector means,
   a second amplifier means coupled to said second detector means,
   a difference integrating means having first and second inputs and an output, said first input connected to the first amplifier means and said second input connected to the second amplifier means, said difference integrating means to integrate the difference between the outputs of said first and second detecting and amplifying mean,
   said adjustable signal source means being connected to and controlled by said output from the difference integrating means to form a closed loop comprising the adjustable signal source means, the second detector means, the second amplification means, and the difference integrating means, and
   means for reporting current flow in the closed loop.

2. The automatic control system of claim 1 wherein said first and second detector means are of identical construction and operate under the same conditions.

3. The automatic control system of claim 1 wherein said adjustable signal source means is an adjustable amplitude oscillator means controlled by said output from the difference integrating means.

4. The automatic control system of claim 3 wherein said difference integrating means is used to drive the level of the adjustable amplitude oscillator means.

5. The automatic control system of claim 1 wherein the entire system is easily portable.

6. The automatic control system of claim 1 wherein the entire system is battery powered.

7. The automatic control system of claim 1 further comprising means to report the power of the power input at said first input means.

8. The automatic control system of claim 1 wherein the entire system is enclosed in a single housing.

9. The automatic control system of claim 1 further comprising
   a first signal path for said radio frequency power input through the first detector means to the output of the first amplifier means, and
   a second signal path for said signal source through the second detector means to the output of the second amplifier means,
   said first and said second signal paths having an identical transfer function.

10. A method of measuring radio frequency power of an electronic signal, said method comprising
    providing an input for receiving an unknown radio frequency signal,
    detecting said unknown radio frequency signal,
    amplifying said unknown radio frequency signal,
    providing a closed reference-power loop comprising an adjustable signal source, second detector means, second amplification means, and difference integrating means connected to form a loop,
    providing a reference power signal in said closed reference-power loop,
    providing said amplified unknown radio frequency signal to said difference integrating means,
    determining the difference between said amplified unknown radio frequency signal and said reference power signal.

11. The method of claim 10 further comprising applying the output of the difference integrating means to the adjustable signal source and modifying the adjustable signal source until the adjustable signal source balances the amplified unknown radio frequency signal.

12. The method of claim 10 further comprising reporting the value of the current flowing in the closed reference-signal loop.

* * * * *